United States Patent [19]

Abe

[11] Patent Number: 5,274,575
[45] Date of Patent: Dec. 28, 1993

[54] METHOD OF PROBING TEST

[75] Inventor: Yuuichi Abe, Hachioji, Japan

[73] Assignee: Tokyo Electron Limited, Tokyo, Japan

[21] Appl. No.: 693,536

[22] Filed: Apr. 30, 1991

[30] Foreign Application Priority Data

May 14, 1990 [JP] Japan ............... 2-123396

[51] Int. Cl.$^5$ ............................... G06F 15/46
[52] U.S. Cl. ..................... 364/559; 364/488;
364/489; 356/394; 356/400; 250/491.1
[58] Field of Search ............ 364/488, 489, 559, 552;
356/400, 401, 394, 152; 250/491.1

[56] References Cited

U.S. PATENT DOCUMENTS

| | | | |
|---|---|---|---|
| 4,780,617 | 10/1988 | Umatate et al. | 364/559 |
| 4,845,373 | 7/1989 | Jamieson et al. | 356/400 |
| 4,856,904 | 8/1989 | Akagawa | 364/559 |
| 5,050,111 | 9/1991 | Ayata et al. | 364/559 |
| 5,093,797 | 3/1992 | Yotsuya et al. | 364/489 |
| 5,097,406 | 3/1992 | Narasimhan et al. | 364/559 |
| 5,124,931 | 6/1992 | Iwamatsu et al. | 364/489 |

*Primary Examiner*—Vincent N. Trans
*Attorney, Agent, or Firm*—Oblon, Spivak, McClelland, Maier & Neustadt

[57] ABSTRACT

A method of the probing test comprising the steps of detecting a first scribe line of chips in a wafer, calculating a first center line of said first scribe line on the basis of the resultant, detecting a second scribe line intersecting the first scribe line, calculating a second center line of said second scribe line on the basis of the resultant, calculating a crossing point of the first and second center lines, identifying a reference pad of a first chip at predetermined position by referring to the crossing point, positioning a reference probe, which has a predetermined positional relationship with the crossing point, at the reference pad on the first chip, moving the test object. Therefore, each of the pads is respectively contacted with each of the probes.

13 Claims, 4 Drawing Sheets

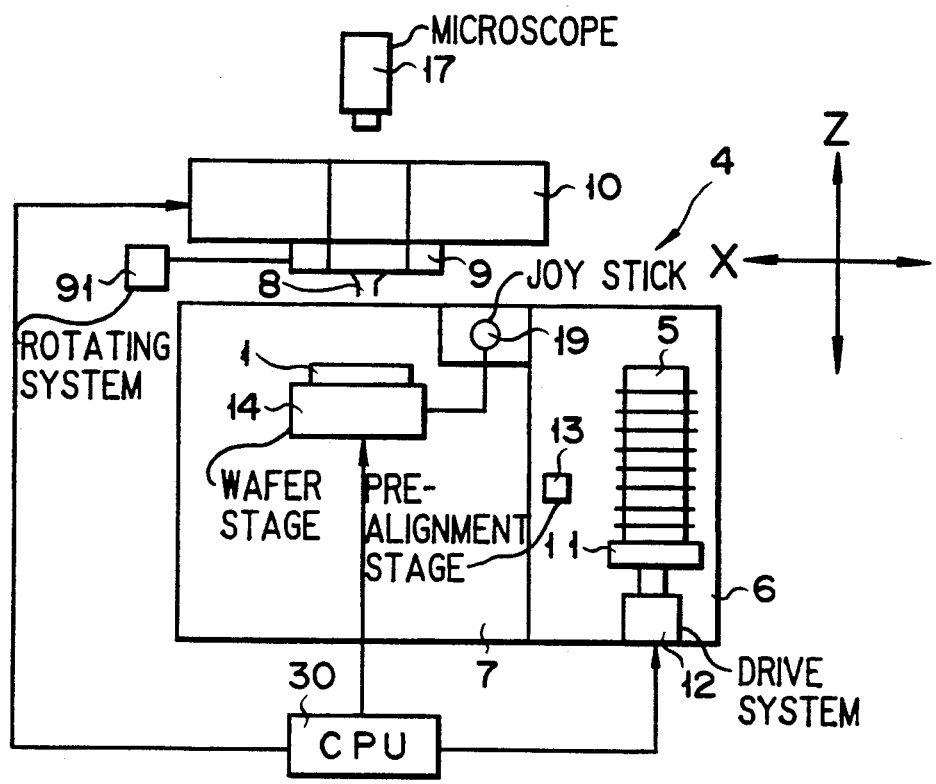
FIG. 1
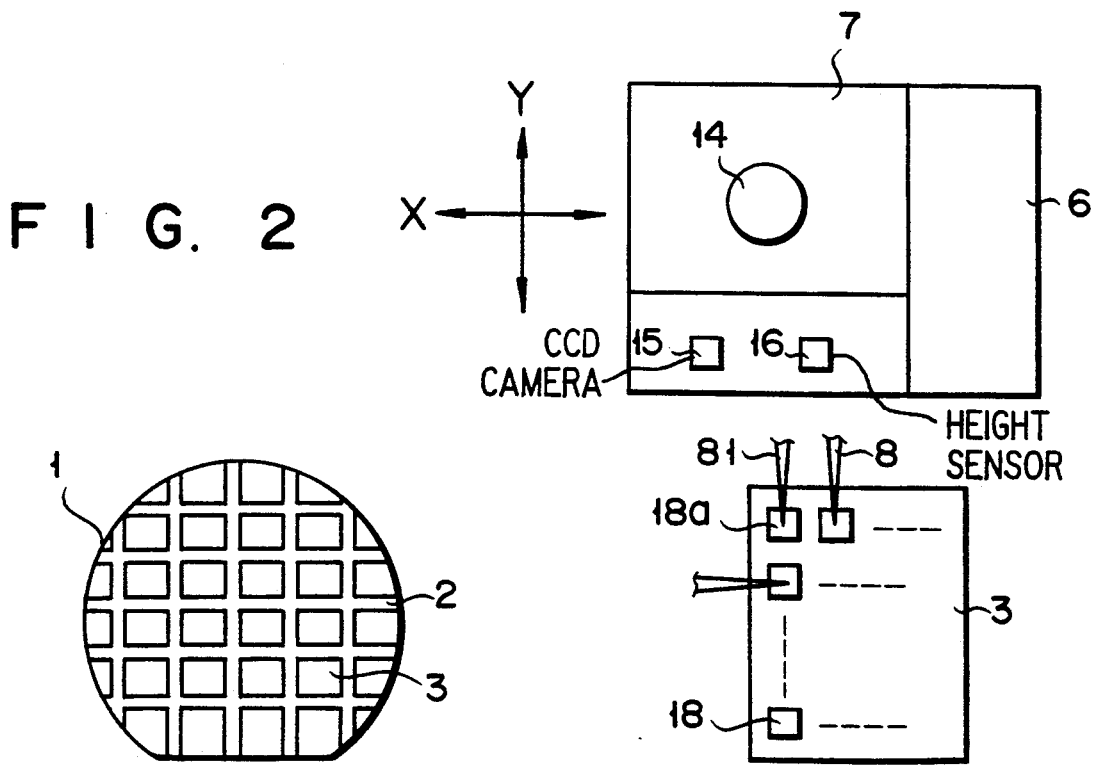
FIG. 2
FIG. 3
FIG. 4

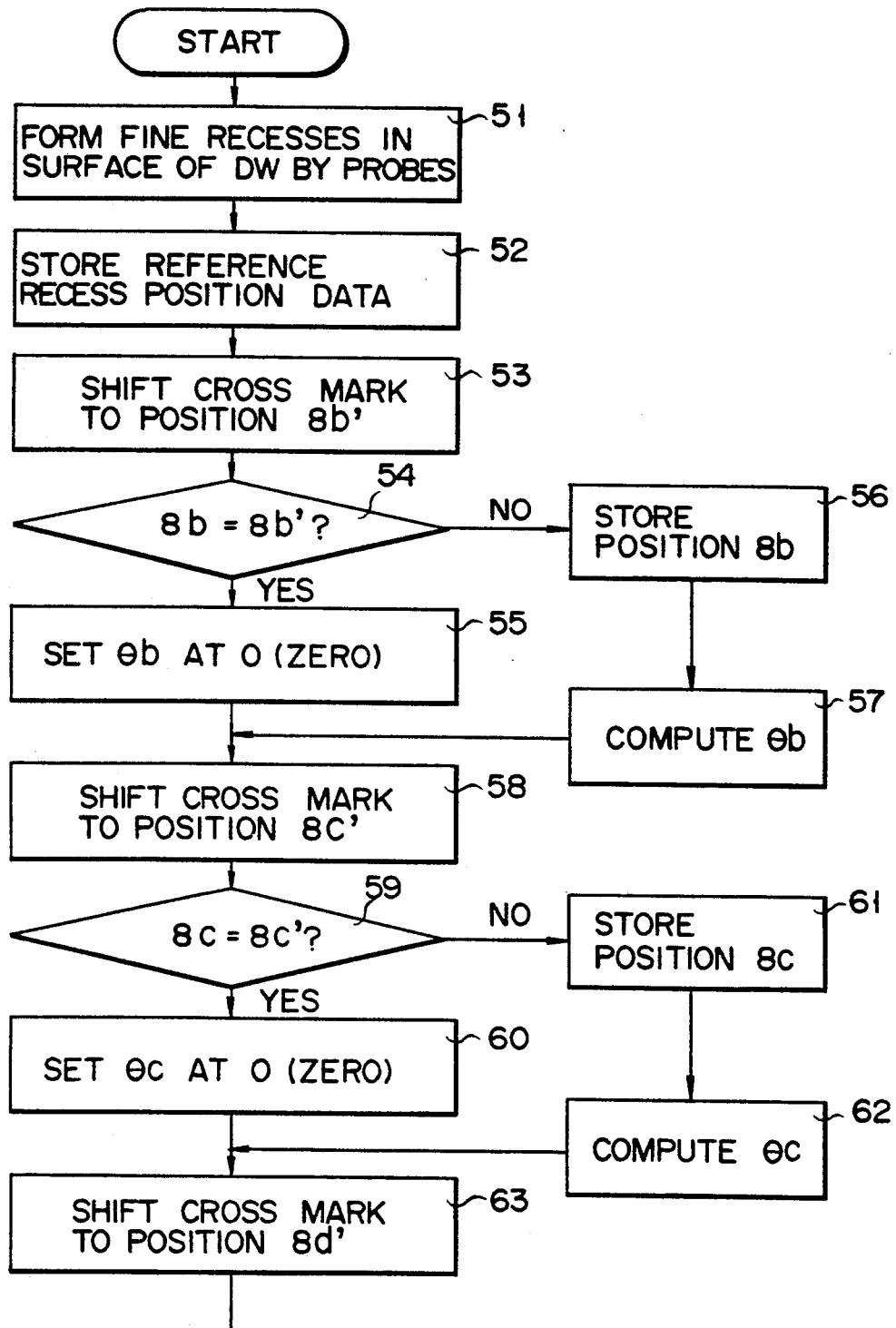
F I G. 5A

METHOD OF PROBING TEST

BACKGROUND OF THE INVENTION

Field of the Invention

The present invention relates to a method of probing test for aligning a large number of probes relative to the positions of a large number of pads of IC chips on a semiconductor wafer.

Any conventional probing test machine (hereinafter merely called a "prober") available for a power-supply test performed against circuitry of an IC chip incorporates a loading/unloading section, a probing section, and a testing section, respectively. The loading/unloading section incorporates an alignment stage. The probing section incorporates a wafer stage and a probe card. The testing section incorporates a wafer stage and a probe card. The testing section incorporates a tester for applying test signals.

In order to automatically execute tests by operating a wafer prober, first, the wafer prober extracts a semiconductor wafer from a cassette stored in the loading/unloading section, and then delivers the extracted semiconductor wafer to the alignment stage before executing a preliminary alignment (which is substantially a process to properly position an orientation flat) of the semiconductor wafer on the alignment stage. After completing the preliminary alignment, the semiconductor wafer is transferred to the wafer stage of the probing section, and then the wafer prober executes a process to properly position the array of rectangular pads (eg. length of side of pad is 60 to 100 $\mu$m) formed on an IC chip on the semiconductor wafer relative to the array of probes. After completing this positioning process, all the probes are brought into contact with those corresponding pads to allow specific current to flow through them, and then the wafer prober transmits specific test signals to the tester of the testing section. In response to the received test signals, the tester automatically identifies whether the tested IC chips are acceptable, or not.

When executing a probe test, a dummy wafer is used, where the position of a wafer card is preliminarily corrected so that the position of the wafer card can be held in each of X, Y, Z, and $\theta$ directions, against the wafer stage. The term "dummy wafer" designates such a wafer available for executing a simulation test, which is made of aluminium-evaporated pattern exactly identical to the actual pattern of the semiconductor wafer which is designated to be a commercial product.

A memory of the prober preliminarily stores data on the arrangement of all the pads of the IC chip. Based on this data on the arrangement of all the pads, the prober automatically executes probing tests against IC chips available for industrial use.

The semiconductor wafer is preliminarily aligned on the alignment stage. Then, the preliminarily aligned wafer is conveyed onto the wafer stage. Next the wafer stage is moved to the probe position represented by the data stored in memory. There is still a slight positional deviation between the probes and the pads. In order to bring the probes into contact with the pads, the operator must measure the deviation and eliminate the deviation between the probes and the pads.

To eliminate the deviation the operator normally adjusts, the position of the wafer stage until the probes come into contact with the corresponding pads. The data on the adjusted position of the wafer stage is stored into the memory of the prober. This process is conventionally called "teaching".

Whenever changing the available specification and the kind of the semiconductor wafer, an applicable probe card is also replaced, thus obliging the operator to execute a "teaching" operation whenever changing the probe card. After completing the "teaching" operation, the prober transfers the wafer stage by a distance corresponding to a pitch between IC chips, and then automatically and sequentially measures the positions of the IC chips. After completing a test on a semiconductor wafer, this wafer is brought back to the cassette, and then, the wafer prober conveys the next semiconductor wafer onto the wafer stage for the next test.

When measuring the deviant positions between the pads and the probes, a number of probes are brought into contact with the dummy wafer so that a number of fine recesses can be generated on the surface of the dummy wafer, and then, using these fine recesses, the wafer prober computes the deviation of the positions between those probes and pads. Concretely, based on the data on the positions of these recesses, the wafer prober identifies the amount of deviation present between the actual positions of the probes and the pads and those positions of the second, third, fourth probes on, which ought to be at the normal positions, respectively.

Based on the computed amount of the deviant positions between those probes and pads, the operator rotates the probe card by a certain amount corresponding to minus $\theta$ in order to correct the position of the probe card. Next, the operator mounts the wafer (which is subject to the initial measurement and a preliminary alignment process on the alignment stage) on the wafer stage. Note that, after turning the semiconductor wafer by an angle $\theta$, the position of the semiconductor wafer relative to the probe is already corrected as of this time. Next, the operator visually corrects the position of the wafer stage with a microscope. More particularly, the prober operator shifts the wafer stage in the directions of axes X and Y up to a specific position where a reference pad can be brought into contact with a reference probe of the IC chip by manually operating the wafer-stage driving mechanism. In the final step, data on the position of the wafer stage is stored in memory of the wafer prober to complete a "teaching" operation. Next, based on the value yielded from the "teaching" operation, the wafer prober convey the wafer before automatically executing a probe test.

On the other hand, since about 500 pads are formed on a single IC chip, it is extremely difficult for the prober operator to correctly identify the position of the reference probe relative to the position of the reference pad by directly and visually checking all the pads on the IC chip with a microscope. In other words, it is extremely difficult for the operator to correctly identify the reference pad from an extremely large number of pads and then bring the reference probe into contact with the reference pad, and yet, it takes a very long while before correctly identifying the reference pad. As a result, the operator often incorrectly identifies the reference pad.

SUMMARY OF THE INVENTION

The primary object of the invention is to provide a novel method of executing an alignment in the course of a probing test, which allows the prober to correctly measure the deviant amount of relative positions between the reference pad and the reference probe in a very short period of time without causing the operator to incorrectly identify the reference pad by easily allowing the prober system to correct deviated positions between the reference pad and the reference probe.

According to an aspect of the invention, a method of probing test, comprises the steps, detecting a first scribe line formed between each other of chips in a test object, calculating a first center line of said first scribe line on the basis of the resultant, detecting a second scribe line intersecting the first scribe line, calculating a second center line of said second scribe line on the basis of the resultant, calculating a crossing point of the first center line and the second center line, identifying a reference pad of a first chip at a predetermined position by referring to the crossing point; positioning relationship with the crossing point, at the reference pad on the first chip, moving at least one of the test object and the probes, thereby contacting respectively the pads to the probes, and applying a test signal from the probes to the pad.

Those IC chips on a wafer are respectively disposed across scribe lines. Before executing a probe test, while performing an alignment process for detecting deviant positions between the wafer (concretely, those pads on an IC chip) and the probes which are substantially contact elements, the wafer prober identifies the intersecting point of the first and second scribe lines, and then, based on the data designating the distance between the intersecting point of those scribe lines preliminarily stored in memory of the prober and the reference pad on the IC chip, the wafer prober can correctly detect the position of the reference pad. Next, the wafer can correctly position the reference probe by shifting it to the position of the reference pad. As a result, there is no probability of causing the operator to incorrectly identify the reference pad, thus enabling the wafer prober to complete the whole alignment processes in a very short period of time.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is an overall schematic block diagram of the probing test apparatus according to an embodiment of the invention;

FIG. 2 is a simplified schematic plan of a semiconductor wafer as shown in a top view;

FIG. 3 is an overall schematic view of a semiconductor wafer;

FIG. 4 is an enlarged plan of an IC chip in which probes are brought into contact with corresponding pads;

FIGS. 5A, 5B are an operational flowchart describing the sequential steps of executing alignment of the probes and pads of an IC chip;

DETAILED DESCRIPTION OF THE PREFERRED EMBODIMENTS

Figure 5B:
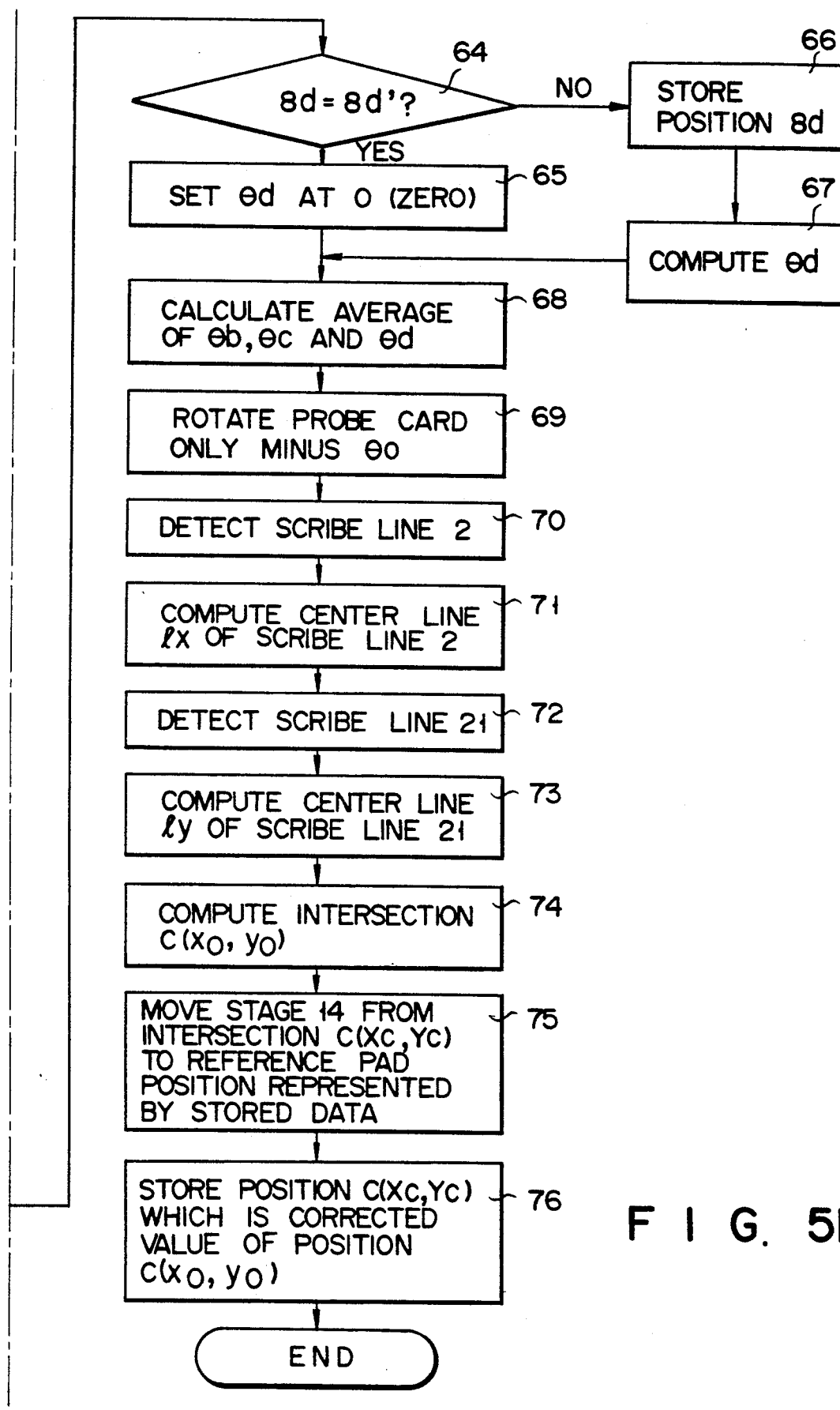

Referring now more particularly to the accompanying drawings, a variety of embodiments of the invention are described below.

First, refer to FIG. 1. The main unit of a wafer prober 4 incorporates a loading/unloading section 6 which accommodates a plurality of cassettes storing a number of semiconductor wafers 1, a test section 7 which executes a probing test, and a test head 10 which is provided with a probe card 9, respectively. The test head 10 is installed by way of allowing probes 8 of the probe card 9 to directly face the upper surface of the test section 7. The loading/unloading section 6 is provided with a mounting base 11 which mounts a plurality of cassettes 5 each containing 25 pieces of the wafer 1 for example. The mounting base 11 is coupled with a vertical-directional drive system 12 which is controlled by a CPU 30. The loading/unloading section 6 is further provided with a conveying arm (not shown) which extracts each piece of the wafer 1 from the cassette 5, and then conveys it onto a pre-alignment stage 13.

The pre-alignment stage 13 incorporates an optical sensor (not shown) and a stage driving system (not shown). The optical sensor contains a light emitting element and a light receiving element. The optical sensor detects peripheral edges of the wafer 1. This in turn allows the wafer 1 to receive a preliminary alignment process in order that the orientation flat of the wafer 1 can correctly be oriented in the desired direction. The pre-alignment stage 13 executes a relatively coarse pre-alignment process.

The test section 7 incorporates a conveying unit (not shown) which conveys the preliminarily aligned wafer 1. The wafer stage 14 mounting the wafer 1 is provided on the surface of an X-Y-Z-$\theta$ stage (not shown). Power supply source delivered to a motor driving the X-Y-Z-$\theta$ stage is connected to the output terminal of the CPU 30. The $\theta$ stage pivots itself on the axis Z.

In order that the preliminarily aligned wafer 1 can properly be conveyed in the aligned posture, the wafer stage 14 incorporates a conveying means like a vacuum absorber. Shifting stroke of the wafer stage 14 is fully controlled by the CPU 30. The wafer stage 14 is connected to a joy stick 19 which can be handled by the prober operator. The joy stick 19 controls the transferable amount of the wafer stage based on micron order.

As shown in FIG. 2, a CCD camera 15 (which is substantially an alignment device) and a height sensor 16 are respectively installed to specific positions of the test section 7. The CCD camera 15 and the height sensor 16 are respectively made available for correctly positioning the wafer 1 on the wafer stage 14. The CCD camera 15 is connected to the input terminal of the CPU 30. On the other hand, the CPU 30 incorporates a means for causing image data delivered from the CCD camera 15 to identify the intersecting point between scribe lines, a means for identifying a reference pad 18a of an IC chip 3 which is positioned at the predetermined distance from the intersecting point of scribe lines, and an alignment means for correctly positioning the reference pad 18a and the probe 8, respectively.

The test head 10 is installed to a specific position directly facing the upper surface of the test section 7. The test head 10 executes the needed alignment and measurement processes by applying check data output from the CPU 30.

As shown in FIG. 4, the probe card 9 is set to the test head 10. The probe card 9 is provided with a number of probes 8 which are to be brought into contact with a number of pads 18 of the IC chip 3. These pads 18 are secured to the probe card 9 based on the predetermined arrangement so that they can properly be compatible with the kind and the size of the available wafer 1. The probe card 9 can be rotated in the desired direction on the way of the positioning process by means of an inserted ring (not shown) connected to a rotating system 91.

The wafer prober 4 further incorporates a probe stocker (not shown) and a conveying unit (not shown). The conveying unit extracts another desired probe card 9 which is compatible with a specific kind of semiconductor wafer from the probe card stocker (not shown), and then sets the extracted probe card 9 to a specific position corresponding to the inserted ring.

Next, referring to the operational flowchart designated in FIG. 5, the sequential steps of properly aligning the probes 8 with the pads 18 of an IC chip 3 are described below.

When starting up the alignment process, first, step 51 is performed, in which, using the pre-alignment stage 13 of the loading/unloading section 6, a dummy wafer DW is preliminarily aligned in order that a horizontal orientation can correctly be oriented in the predetermined direction. Then, the dummy wafer DW is conveyed onto the wafer stage 14. Next, the wafer stage 14 is lifted to cause a plurality of probes 8 (four probes for example) to come into contact with the dummy wafer DW so that fine pin holes (recesses) ca be generated on the surface of the dummy wafer DW. Next, the prober operator transfers the wafer stage 14 mounting the dummy wafer DW to a specific position corresponding to the CCD camera 15, and then photographs those fine recesses generated on the surface of the dummy wafer DW.

Figure 6:
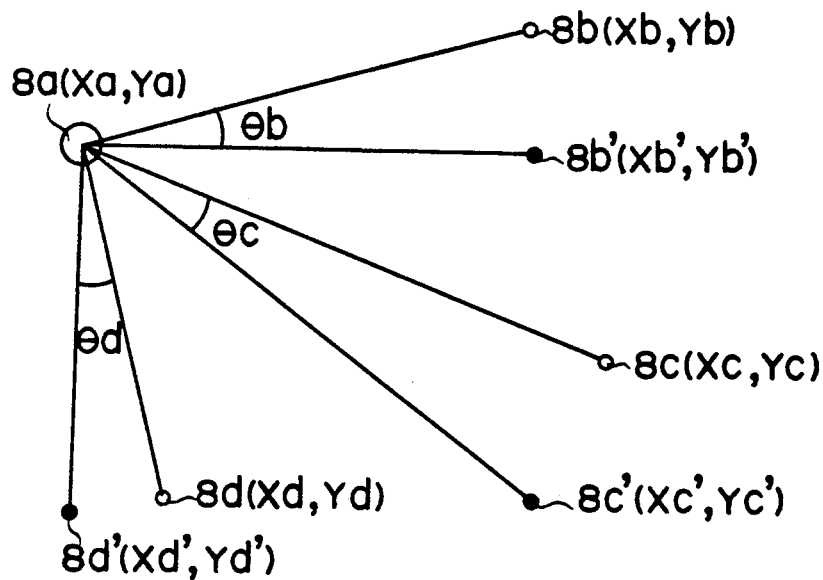
FIG. 6 is a rotary coordinate chart which is explanatory of the method of aligning the probes and pads of an IC chip.

Next, step 52 is performed, in which, as shown in FIG. 6, among those fine recesses 9a through 8d photographed by the CCD camera 15, the fine recess formed by a reference probe 81 (shown in FIG. 4) is designated to be the first fine recess 8a. Next, the prober operator transfers the wafer stage 14 by operating the joy stick 19 in order that a cross mark in the sight of the CCD camera 15 can correctly match the fine reference recess 8a. Next, the prober operator inputs this position data 8a (Xa, Ya) to a memory of the CPU 30 for storage.

Next, step 53 is performed, in which, according to the transferable amount preliminarily stored in the wafer prober 4 after executing a computation based on the fine reference recess position 8a (Xa, Ya), the prober operator shifts the cross mark in the sight of the CCD camera 15 to the expected position 8b' (Xb', Yb') of the second probe recess 8b (Xb, Yb).

While executing this process, if the relationship Xb=Xb' and Yb=Yb' were satisfied, then, it designates that no deviation occurs in the rotation between the probe card 9 and the dummy wafer DW, and thus, no correction is needed. As a result, the operational mode proceeds to step 58 via steps 54 and 55. On the other hand, if there were such a relationship like Xb * Xb≠ and Yb≠Yb', then step 54 is performed, in which the CPU 30 identifies that a certain deviation is generated in the $\theta$ rotation between the probe card 9 and the dummy wafer DW. In response to this, step 56 is carried out, in which the prober operator operates the joy stick 19 in order to bring the cross mark in the sight of the CCD camera 15 into perfect accord with the actual fine recess 8b (Xb, Yb), and then inputs this position data to a memory of the CPU 30 for storage. Next, step 57 is performed to activate the wafer prober 4 to compute the deviant rotation amount $\theta b$.

While steps 58 through 62 are underway, the wafer prober 4 computes the deviant rotation amount 8c by referring to the third fine recess $\theta c$ (Xc, Yc) and the expected position 8c' (Xc', Yc') by sequentially executing those processes mentioned above. Next, while steps 63 through 67 are underway, the wafer prober 4 computes the deviant rotation amount $\theta d$ by referring to the fourth fine recess 8d (Xd, Yd) and the expected position 8d' (Xd', Yd') by sequentially executing those processes mentioned above.

Next, step 68 is carried out, in which, wafer prober 4 computes the mean value $\theta_0$ of those deviant rotation amounts including $\theta b$, $\theta c$, and $\theta d$. Next, step 69 is performed, in which, based on the computed mean value $\theta_0$, the rotating system 91 of the wafer prober 4 rotates the probe card 9 by a specific amount corresponding to minus $\theta_0$ in order to correct deviation of the rotation of the probe card 9. It should be understood that, even though the above system computes the deviant amount of the rotation of the probe card 9 by referring to four recesses 8a through 8d, the wafer prober 4 can correctly measure the deviant amount of the rotation of the probe card 9 by referring to two of those recesses formed on the surface of the probe card 9.

Next, step 70 is executed, in which the prober operator unloads the dummy wafer DW from the wafer stage 14, and then, the prober operation loads the wafer 1 (which is offerable for a commercial product) on the wafer stage 14. Next, the prober operator photographs part of the wafer 1 with the CCD camera 15 is order to detect the first scribe line 2.

Figure 7:
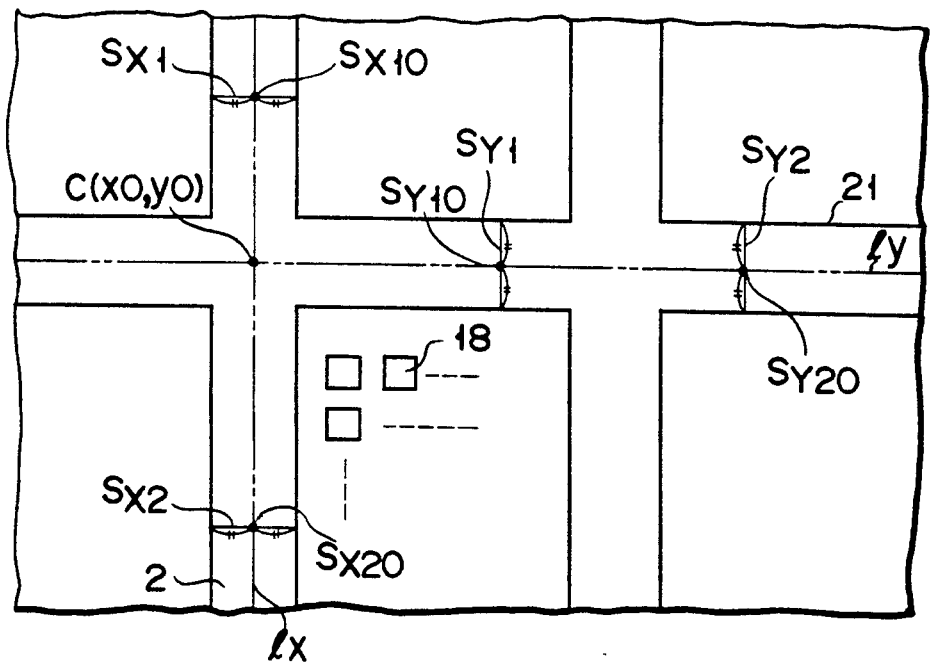
FIG. 7 is a partially enlarged view of part of scribe lines of a semiconductor wafer for explaining the method of executing the alignment embodied by the invention.

Next, step 71 is executed, in which, as shown in FIG. 7, by operating the joy stick 19, the prober operator brings the cross mark in the sight of the CCD camera 15 into perfect accord with the center points $SX_{10}$ and $SX_{20}$ in the width of the first scribe line 2 at two different positions $SX_1$ and $SX_2$ which are apart from each other in the scribe line 2, and then the operator inputs the data on these center points to a memory of the CPU 30 for storage. Next, the wafer prober 4 activates the CPU 30 to compute the center line 1x of the first scribe line 2 by referring to the data on these two center points $SX_{10}$ and $SX_{20}$.

Next, step 72 is executed, in which the wafer prober 4 detects the second scribe line 21 orthogonally intersecting the first scribe line 2. Next, step 72 is performed, in which the operator executes those sequential processes by operating the joy stick 19 including the following: In the same way as was done for the preceding steps, the operator brings the cross mark in the sight of the CCD camera 15 into perfect accord with those center points $SY_{10}$ and $SY_{20}$ in the second scribe line 21 at two different positions $SY_1$ and $SY_2$ of the second scribe line 21 orthogonally intersecting the first scribe line 2. Next, the operator activates the wafer prober 4 to detect the center line 1 of the second scribe line 21 by referring to the data on those center points $SX_{10}$ and $SX_{20}$.

Next, step 74 is carried out, in which the prober operator operates the wafer prober 4 to detect a crossing point C ($X_0$, $Y_0$) between those two center lines 1 and 1x, and then inputs the data of this intersecting point C ($X_0$, $Y_0$) to a memory of the CPU 30 for storage.

Next, step 75 is executed, in which the crossing point C ($X_0$, $Y_0$) is assumed to be the origin on the coordinate axis.

Next, the operator shifts the wafer stage 14 in the directions of axes X and Y from the crossing point C ($X_0$, $Y_0$) as original point in order that the reference probe 81 can be brought into contact with the reference pad 18a, where the position of the reference pad 18a is preliminarily stored in a memory of the CPU 30.

Now, since the reference probe 81 correctly aligns the position of the reference pad 18a, and yet, since the direction of the $\theta$ rotation is already corrected by those processes executed in the preceding steps 51 through 69, those probes 8 other than the reference probe 81 respectively match those corresponding pads other than the reference pad 18a.

However, in order to make sure that those probes and pads other than the reference probe 81 and the reference pad 18a securely remain in perfect accord with each other, the operator visually inspects these components elements on the surface of the IC chip with a microscope 17. In the vent that the prober operator detects deviate positions between those probes 8 and pads 18, he finely adjusts the position of the wafer stage 14 by operating the joy stick 19. As a result, the final step 76 is executed, in which, after completing fine adjustment of the position of the wafer stage 14, the operator again activates the wafer prober 4 to correct those coordinates ($x_0$, $y_0$) of the crossing point C between those center lines 1x and 1y stored in memory, and then the corrected coordinate values are stored in a memory of the CPU 30. After executing the final step 76, the whole adjustment (teaching) processes for aligning the probes 8 with pads 81 are completed. Thereafter, each of IC ships, which are formed on the wafer, is aligned for the probe card 9, thereby it is sequentially tested by the tester.

After completing the probing test applied to the IC chip 3, the operator accesses the corrected coordinate value of the crossing point C of the center line from the internal memory of the CPU 30, and then, based on the accessed coordinate value, the prober operator shifts the wafer stage 14 so that the following IC chip 3 can correctly be positioned right below the probes 8. Next, the wafer prober 4 tests the following IC chip 3 by repeating those sequential processes executed in steps 70 through 76. By sequentially repeating these processes executed in steps 70 through 76, the wafer prober 4 tests all the IC chips 3 mounted on a semiconductor wafer 1. After completing the whole probing test processes, the conveyor unit of the wafer prober 4 brings the semiconductor wafer 1 from the wafer stage back to the cassette 5.

The above description has solely referred to the alignment system of the wafer prober according to an embodiment of the invention. In the above embodiment, the operator causes the CPU 30 to internally store the data of positionwise deviation which takes place between the actually formed recesses and the expected recesses by aligning the actual recess formed on the surface of the dummy wafer DW with the cross mark in the sight of the CCD camera 15. Nevertheless, it should also be understood that the scope of the invention is not merely confined to the above embodiment, but it is also possible for the invention to introduce such a method which, based on the result of identification of the image photographed by the CCD camera 15 in comparison with the preliminarily stored image data, causes the wafer prober 4 to compute the deviation of positions of the probes 8 and the pads 18, and then computes the $\theta$ rotation of the probe card 9 before eventually correcting the $\theta$ rotation by means of the rotating system of the wafer prober 4.

It is also possible for the invention to introduce such an alignment system which causes the wafer prober 4 to compute the positionwise deviation between the probes 8 and the pads 81 by referring to the accord an disaccord between the actual scribe lines and the image preliminarily stored in an image identifying means. Introduction of this system is quite instrumental to the materialization of a fully automated alignment system, thus fully eliminating manual control operation thus far being performed by the operator.

The above description has solely referred to the method of aligning the positions of the probes 8 and the pads 18 by initially computing the crossing point of the first and second scribe lines before identifying the position of the reference pad based on the distance between the preliminarily input data of the intersecting point and the reference pad. Alternatively, it is also possible for the invention to initially cause the wafer prober to identify the positions of the corners of the IC chip 3, and then identify the position of the reference pad by referring to these scribe lines.

When introducing those modified embodiments of the invention mentioned above, in order to check those wafers of a specific kind other than those wafers thus far checked, the wafer prober 4 automatically extracts a different probing card from the stocker storing those probe cards, and then replaces the former probing card with the new one before repeating those sequential processes executed in above-mentioned steps 51 through 69 described earlier. Concretely, those probes 8 are brought into contact with the dummy wafer DW to generate fine recesses, and then, the amount of the deviation in the $\theta$ rotation performed by the probe card 9 is computed by the CPU 30 based on those fine recesses before eventually enabling the wafer prober 4 to fully eliminate the deviation from the $\theta$ rotation by automatically rotating the probe card 9 in the minus direction. Next, the wafer prober 4 automatically detects the first and second scribe lines and then computes the intersecting point between these scribe lines by referring to the identical image data. As a result, by referring to the preliminarily input data of the crossing point between these scribe lines and the position of the reference pad, the wafer prober 4 can automatically execute alignment of the intersecting point between these scribe lines and the reference pad. In consequence, the wafer prober can also check those wafers of other kinds by applying a fully automated system as well.

It should also be understood that the applicability of the invention is not merely confined to the wafer prober available for testing wafers, but the art embodied by the invention is also effectively applicable to the probing test of an LCD substrate and printed wiring board substrate as well.

Finally, the advantageous effects of the invention are summarized below. According to the wafer prober system embodied by the invention, a specific means for identifying the scribe lines is provided to allow the wafer prober to automatically identify the position of the reference pad by referring to the scribe lines. As a result, the operator can correctly identify the reference pad out of a large number of pads, and therefore, a large number of pads can securely and easily be aligned with corresponding probes in a very short period of time, and the probing test is quickly performed.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A method of probing test, comprising the steps of:
   storing in a memory/calculation means a first relative positional relationship between a reference probe and a reference point in a test scope and a second relative positional relationship between said reference point and a simulation pad simulating a reference pad of an object to be tested;
   detecting a first scribe line formed between adjacent chips in the object;
   calculating a first center line of said first scribe line by the memory/calculation means on the basis of the detected first scribe line;
   detecting a second scribe line intersecting said first scribe line;
   calculating a second center line of said second scribe line by the memory/calculation means on the basis of the detected second scribe line;
   calculating a crossing point of said first center line and said second center line by the memory/calculation means;
   reading said second relative positional relationship out of the memory/calculation means;
   identifying a reference pad from among a large number of pads on the basis of the second relative positional relationship, the reference point and the crossing point;
   reading said first relative positional relationship out of the memory/calculation means;
   aligning the reference probe with the reference pad within the test scope on the basis of the first relative positional relationship and the reference point;
   moving at least one of the object and the probes, thereby allowing said pads to contact said probes, respectively; and
   applying a test signal from said probes to said pads.

2. A method of probing test according to claim 1, further comprising the steps of:
   forming fine recesses on a dummy wafer by said probes;
   computing deviation of $\theta$ rotation between said probes and a stage for loading said test object; and
   preliminarily correcting deviation of $\theta$ rotation between said probes and said stage.

3. A method of probing test according to claim 2, wherein said deviation of $\theta$ rotation is computed for a plurality of rounds, and then mean value sought from these serial computations is specifically used for correcting deviation of said $\theta$ rotation.

4. A method of probing test according to claim 3, wherein four fine recesses are formed on the dummy test object so that these four fine recesses are used for correcting mean value of the deviation of said $\theta$ rotations.

5. A method of proving test according to claim 1, further comprising the step of:
   preparing a height sensor, and detecting a height of said pad from a base position.

6. A method of probing test according to claim 1, wherein said test object is loaded on a X-Y-Z-$\theta$ stage.

7. A method of proving test according to claim 1, further comprising the steps of:
   aligning an orientation flat of said test object with predetermined orientation.

8. A method of probing test, comprising the steps of:
   preparing a probe card including a plurality of probes;
   storing in a memory/calculation means a fist relative positional relationship between the reference probe and a reference point in a test scope and a second relative positional relationship between said reference point and a simulation pad simulating a reference pad of an object to be tested;
   detecting a first scribe line formed between adjacent chips in the object;
   calculating a first center line of said first scribe line by the memory/calculation means on the basis of the detected first scribe line;
   detecting a second scribe line intersecting said first scribe line;
   calculating a second center line of said second scribe line by the memory/calculations means on the basis of the detected second scribe line;
   calculating a crossing point of said first center line and said second center line by the emory/calculation means;
   reading said second relative positional relationship out of the memory/calculation means;
   identifying said reference pad from among a large number of pads on the basis of the second relative positional relationship, the reference point and the crossing point;
   reading said first relative positional relationship out of the memory/calculation means;
   aligning the reference probe with the reference pad within the test scope on the basis of the first relative positional relationship and the reference point;
   moving at least one of the object and the probes, thereby allowing said pads to contact said probes, respectively;
   applying a test signal from said probes to said pads; and
   automatically exchanging said probe card for another probe card after testing of said test object.

9. A method of probing test according to claim 8, wherein said probe card is exchanged in accordance with the kind of the test object.

10. A method of proving test according to claim 8, wherein said probe card is exchanged when a dummy wafer exchanges said test object.

11. A method of proving test according to claim 8, further comprising the steps of:
    preparing a CCD camera for identifying said crossing point.

12. A method of probing test according to claim 8, further comprising the step of:
    preparing a CCD camera, and identifying said reference pad by aligning a cross mark of said CCD camera with said crossing point.

13. A method of probing test according to claim 8, further comprising the step of:
    selecting a predetermined probe card in a probe card stocker.

* * * * *